United States Patent [19]
Lotfi

[11] Patent Number: 5,894,432
[45] Date of Patent: Apr. 13, 1999

[54] CMOS MEMORY CELL WITH IMPROVED READ PORT

[75] Inventor: Younes Lotfi, Round Rock, Tex.

[73] Assignee: International Business Machines Corporation, Armonk, N.Y.

[21] Appl. No.: 08/889,728

[22] Filed: Jul. 8, 1997

[51] Int. Cl.$^6$ ............................................ G11C 11/00
[52] U.S. Cl. ........................................ 365/154; 365/230.05
[58] Field of Search .............................. 365/154, 230.05, 365/155, 156

[56] References Cited

U.S. PATENT DOCUMENTS

| | | | |
|---|---|---|---|
| 4,169,233 | 9/1979 | Haraszti | 307/355 |
| 4,480,320 | 10/1984 | Naiff | 365/189 |
| 4,545,033 | 10/1985 | Naiff | 365/51 |
| 4,592,021 | 5/1986 | Suzuki et al. | 365/189 |
| 5,629,901 | 5/1997 | Ho | 365/230.05 |
| 5,642,325 | 6/1997 | Ang | 365/230.05 |
| 5,717,638 | 2/1998 | Kim | 365/230.05 |

*Primary Examiner*—David Nelms
*Assistant Examiner*—David Lam

[57] ABSTRACT

A memory cell with multiple read ports uses fewer NMOS devices, has reduced size, and provides improved performance if less than all of the read ports are used. The memory cell has a flip-flop with a storage node, a write port, and a read port having a plurality of bit lines connected to respective NMOS transistors which are controlled by respective read wordlines, and these NMOS transistors are coupled to ground via one or more additional NMOS transistor whose gates are connected to the storage node. The width of the latter NMOS transistors is larger than the width of the former transistors which are connected to the bit lines. For example, there might be three bitlines connected respectively to three of the first NMOS transistors, which are further connected to only one second NMOS transistor, wherein the second NMOS transistor is about three times as wide as any one of the three first NMOS transistors. The read port provides improved performance if less than all of the read ports are used due to the stronger conduction of the common NMOS device.

15 Claims, 2 Drawing Sheets

CMOS MEMORY CELL WITH IMPROVED READ PORT

BACKGROUND OF THE INVENTION

1. Field of the Invention

The present invention generally relates to computer systems, and more particularly to a memory cell, such as that used in a random access memory (RAM) array, having an improved read port. The invention further relates to a complementary metal-oxide semiconducting (CMOS) memory cell having multiple read ports.

2. Description of the Related Art

A conventional computer system typically has a central processing unit (CPU) or processor which is connected to several peripheral devices, including input/output (I/O) devices (such as a display monitor and keyboard) for the user interface, a permanent memory device (such as a hard disk or floppy diskette) for storing the computer's operating system and user programs, a temporary memory device (such as random access memory or RAM) that is used by the processor to carry out program instructions. The computer system may have additional components and peripherals.

There are generally three types of RAM used for computer memory arrays: dynamic RAM, static RAM, and pseudo-static RAM. Dynamic RAM stores data in capacitors, that is, it can hold data for only a few milliseconds, so DRAM is typically refreshed (precharged) using external refresh circuitry. Pseudo-static RAM is like DRAM with internal refresh circuitry. Static RAM is a read-write memory array whose storage cells are typically made up of four or six transistors forming flip-flop elements that indefinitely remain in a given binary state (i.e., 1 or 0, corresponding respectively to high or low voltage states) until the information in the cell is intentionally changed, or the power to the memory circuit is shut off, so this memory does not need to be regularly refreshed. It is only necessary to restore (electrically precharge) the SRAM array after or before each evaluation (read or write operation). RAM arrays can be used for system memory, or for cache arrays.

In a traditional sense amplifier memory array, each memory cell has a pair of outputs (a true line and a complementary line) which constitute the bit line. These lines are connected to a sense amplifier whose output is read by the processor. During an evaluation cycle, a differential signal is developed between the pair. In other words, one of the T/C lines is in a high state, while the other is in a low state. Use of two such outputs and a sense amplifier simplifies evaluation since it does not require that the lines have a precise voltage, but rather only requires that there be a discernable difference between the two lines, i.e., one is higher than the other. It is also necessary to restore (precharge) the differential T/C pair after or before each access of the memory cell, i.e., raise each line to the high state ($V_{dd}$).

Memory cells with multiple write and read ports are often used in cache array designs. Each read port has a single bitline which is connected to ground through two n-type metal-oxide semiconducting (NMOS) devices in series. During the precharge phase, the bitline in every read port is precharged to $V_{dd}$ potential. During the evaluate phase (read), the contents of the accessed memory cell are read by the bitline being discharged to ground through the two NMOS devices if the stored data in the memory cell is a logic "1" ($V_{dd}$); if the stored data in the cell is a logic "0" (ground potential) then the bitline would remain at $V_{dd}$ potential. The gate of one of the two serially-connected NMOS devices is connected to a "wordline" which is used to select an entire memory word (row) in the memory array. The gate of the other NMOS device is connected to the internal storage node of the memory cell. Usually, due to a large capacitive load on the bitline, the performance of the read operation is limited by the size (width) of the two NMOS devices in the read port. Since the size of the array is governed by the memory cell size, the device sizes of the two NMOS devices are usually small (on the order of 2 μm width).

FIG. 1 illustrates a prior art memory cell 10 with three read ports. Read bitlines 12, 14 and 16 are connected to ground through respective pairs of serially-connected NMOS devices 18 and 20, 22 and 24, and 26 and 28. The gates of the upper row of NMOS devices in the read ports (18, 22 and 26) are controlled by read wordlines 30, 32 and 34. The gates of each of the NMOS devices in the lower row in the read ports (20, 24 and 28) are connected to the internal memory storage node 36, i.e., the storage node of a flip-flop formed by inverters 38 and 40. Storage node 36 is also connected to the drain of another NMOS device 42 whose source is connected to ground, and which is controlled by a clear line 44. Writing to the cell is performed using another NMOS device 46 whose source is connected to the input of inverter 40 (the output of inverter 38). The gate of NMOS write device 46 is connected to a write wordline 48, and its drain is connected to the data line 50.

During precharge, bitlines 12, 14 and 16 are charged to $V_{dd}$ potential and read wordlines 30, 32 and 34 are turned off (at ground potential). During the read operation, PMOS devices holding the bitlines at $V_{dd}$ (not shown) are turned off. The bitline in each port is discharged to ground if the corresponding wordline is selected ($V_{dd}$ potential) and the stored data in the memory cell at node 36 is at logic "1" ($V_{dd}$ potential). If the stored data in the memory cell is a logic "0" (ground potential) then NMOS devices 20, 24 and 28 are turned off and the bitlines remain at $V_{dd}$ potential.

Various other designs for multiple read port memory cells are known in the art. For example, U.S. Pat. No. 4,592,021 discloses a memory cell which requires a is depletion-type MOS transistor ("$T_{rd}$" of FIG. 6 of that patent) to have functional read operation for both data polarities. The cell also uses p-type MOS transistors to discharge the data line to ground potential. This design presents several problems, the first being the requirement of a depletion-type MOS device which complicates the fabrication process. Second, the PMOS device generally takes longer than other (NMOS) devices to discharge since is has a slower conductivity. Finally, the rate that the bitlines are discharged to ground depends upon the number of columns in the array. As the number of columns increases, the number of NMOS devices in the stack increases, which in turn increases the impedance through the NMOS devices in series in the row direction, and results in slower discharge of the bitlines to ground potential. This drawback limits the density of arrays. A further drawback to the construction is that it is efficient only if all of the read ports are used, i.e., no advantage is obtained in using less than all of the read ports and the unused ports represent wasted circuit space. This aspect of that design is particularly bothersome if only a single read port is used. It would, therefore, be desirable to devise a memory cell with multiple read ports which makes more efficient use of space (silicon surface area) so as to decrease the array size, without sacrificing performance. It would be further advantageous if some performance benefit could be achieved by using less than all of the read ports in the memory cell.

SUMMARY OF THE INVENTION

It is therefore one object of the present invention to provide an improved memory cell such as is used in various computer memory arrays.

It is another object of the present invention to provide such a memory cell having multiple read ports, which makes more efficient use of space.

It is yet another object of the present invention to provide such a multipart memory cell which further provides performance advantages when less than all of the read ports are enabled.

The foregoing objects are achieved in a memory cell generally comprising means for electronically storing a binary value, means for writing the binary value to the storing means, and means for reading the binary value from the storing means, the reading means including means for outputting the binary value to one or more of a plurality of bit lines, wherein the reading means has a first access time if the binary value is output to all of said plurality of bit lines, and the reading means has a second access time if the binary value is output to less than all of the plurality of bit lines, the second access time being faster than the first access time. The storing means has a storage node, and the reading means further includes a plurality of first switching devices (NMOS transistors) each coupling a respective one of the bitlines to one or more second switching devices (NMOS transistors) which are further coupled to ground; each of the first switching devices is controlled, respectively, by one of a plurality of read wordlines, and the one or more second switching devices are controlled by the storage node. The first set of NMOS transistors have approximately the same width, and the one or more second NMOS transistors have larger widths, e.g., one of the second NMOS transistors may have a width which is two or three times as wide as the width of one of the first NMOS transistors. Preferably, the combined width of all of the second NMOS transistors is approximately equal to the sum of the widths of the first NMOS transistors. For example, there might be three read ports, i.e., three bitlines, connected respectively to three of the first NMOS transistors, which are further connected to only one second NMOS transistor, wherein the second NMOS transistor is about three times as wide as any one of the three first NMOS transistors.

The foregoing construction simplifies the fabrication process since fewer NMOS devices are needed. The size of the memory cell (and a memory array made from such cells) is significantly reduced. Also, a memory cell constructed in accordance with the present invention provides improved performance if less than all of the read ports are used, due to the stronger conduction of the common NMOS device.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF THE PREFERRED EMBODIMENT

Figure 2:
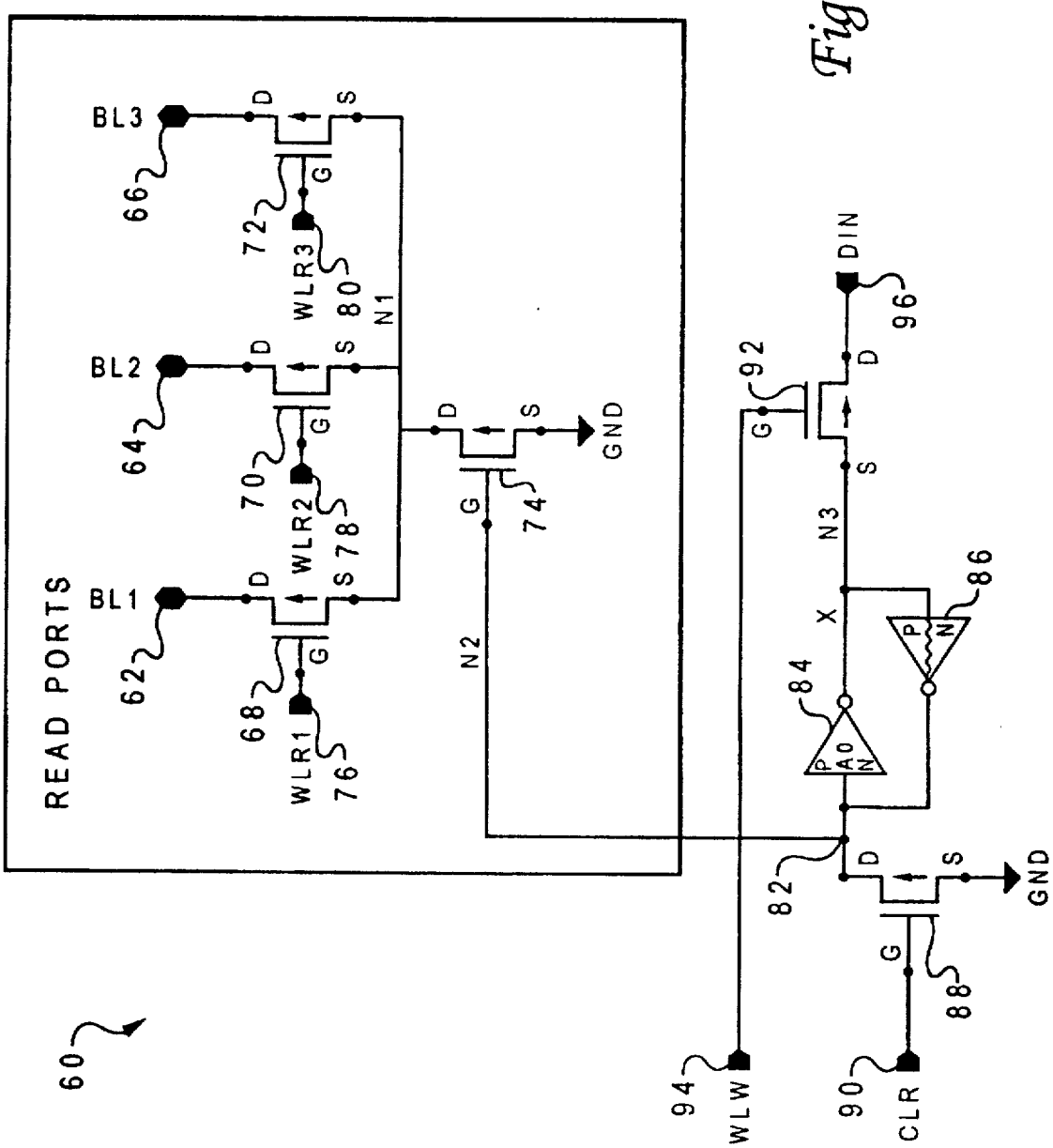
FIG. 2 is a schematic diagram of a memory cell constructed in accordance with the present invention, having a common NMOS device which is used in conjunction with three different read ports.

With reference now to the figures, and in particular with reference to FIG. 2, there is depicted one embodiment 60 of the memory cell of the present invention. Memory cell 60 has three read ports corresponding to three bitlines 62, 64 and 66. Read bitlines 62, 64 and 66 are connected to ground through respective NMOS devices 68, 70 and 72, and through another NMOS device 74 whose drain is connected to the sources of devices 68, 70 and 72, and whose source is connected to ground. The gates of the upper row of NMOS devices 68, 70 and 72 are controlled by respective read wordlines 76, 78 and 80. The gate of NMOS device 74 is connected to the internal memory storage node 82 of cell 60, i.e., the storage node of a flip-flop formed by inverters 84 and 86.

Storage node 82 is also connected to the drain of another NMOS device 88 whose source is connected to ground, and which is controlled by a clear line 90, used to set the cell to a cleared (logical "0") state. Writing to the cell is performed using another NMOS device 92 whose source is connected to the input of inverter 86 (the output of inverter 84). The gate of NMOS write device 92 is connected to a write wordline 94, and its drain is connected to the data line 96.

Figure 1:
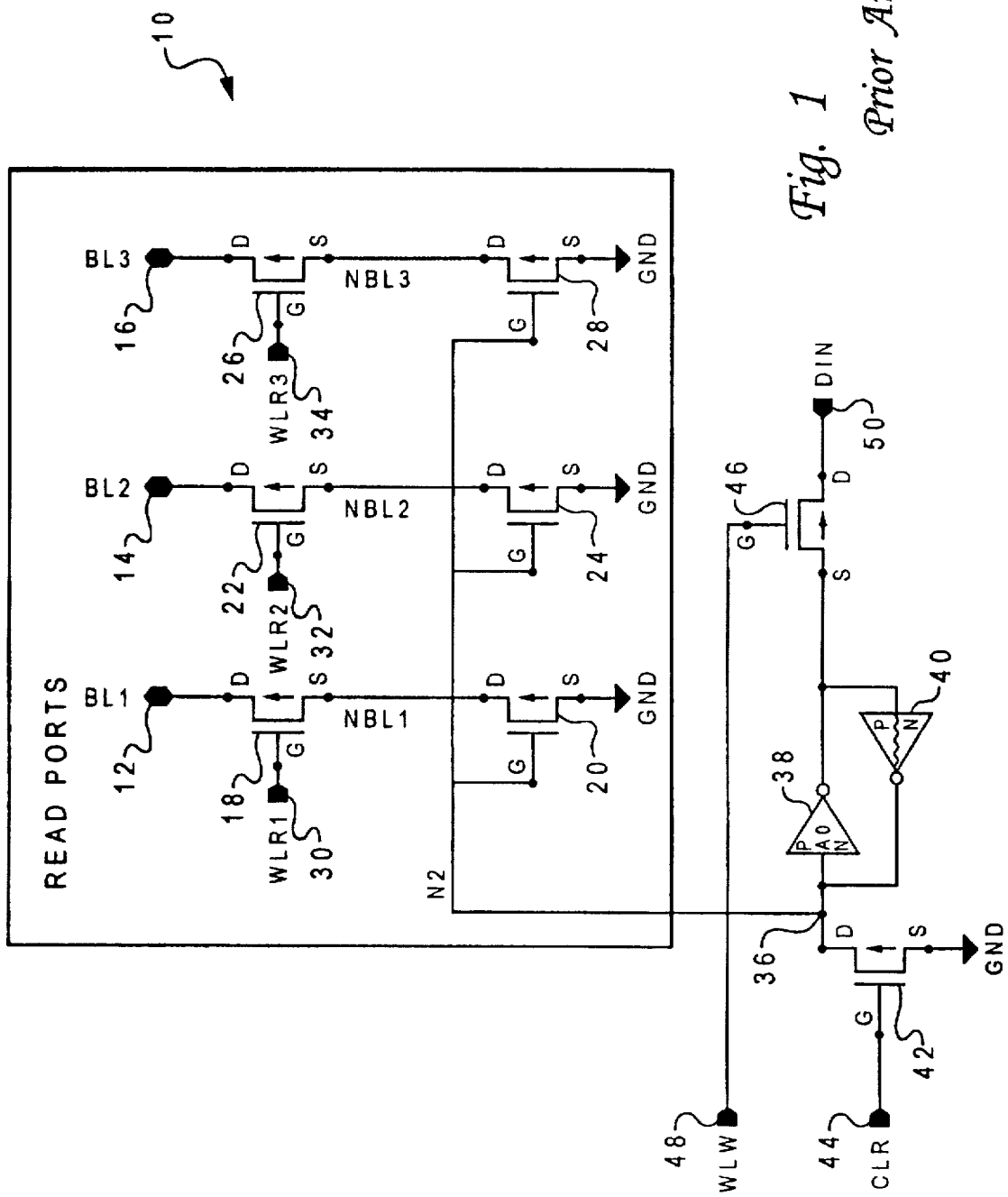
FIG. 1 is a schematic diagram of a prior art memory cell for a computer system, such as random access memory, having multiple read ports.

The present invention modifies the read port circuitry by using the common NMOS device 74 for all three read ports. In order to maintain performance, the width of this single NMOS device is equivalent to the sum of three NMOS devices which would have been used in the prior art (e.g., the three NMOS devices 20, 24 and 28 of FIG. 1). For example, NMOS device 74 might have a width of about 5.85 µm compared to a width of 1.95 µm for each of the three NMOS devices in a prior art memory cell. This maintains an access time of about two nanoseconds for memory cell 60 when all three read ports are enabled.

While the width of the common device 74 may be equivalent to three times the width of a foot device used in the prior art, there is still some savings in circuit space (silicon surface area) associated with reducing the number of foot devices. This increased efficiency, or reduced size, can likewise be achieved in other embodiments, for example, where only two read ports are used having a common NMOS foot device, or where four read ports are connected to two NMOS foot devices, i.e., the two NMOS foot devices are connected in parallel, with their sources connected to ground and their drains connected to the sources of four separate NMOS devices controlled by four wordlines. In the latter embodiment, the two NMOS foot devices would preferably each have a width equal to about twice the width of an NMOS foot device as used in the prior art, but it would be alternatively possible (although unlikely) to used two NMOS foot devices with different widths, for example, one having a conventional width and the other having a width that is equal to about three times a conventional width. As those skilled in the art will appreciate, the present invention generally provides increased efficiency in the use of space for any memory cell having at least two read ports, wherein the number of foot devices is less than the number of read ports.

The present invention has several advantages over prior art memory cells. First, the fabrication process is generally simplified since the present invention reduces the number of NMOS devices needed, and further requires no unusual devices such as depletion-type MOS transistors. Second, the present invention uses NMOS transistors which have a faster conductivity to discharge the data lines to ground potential than do PMOS devices such as those used in U.S. Pat. No. 4,592,021. Third, the size of the memory cell is reduced; in the depicted embodiment, the area of the memory cell is 7–10% less than that of a comparable prior art cell having three separate nodes. This benefit can be of great value with particularly large arrays. Finally, a memory cell constructed in accordance with the present invention provides improved performance if less than all of the read ports are used, due to the stronger conduction of the common NMOS device 74, making the cell much more flexible. For example, in the depicted embodiment, if only two (any two) of the three read ports are enabled and the data is a logical "1", then the read access time drops to 1.7 ns. This performance increase is maximized if only a single read port is used; in the depicted embodiment, read access time for a data value of "1" using just one (any) port drops further to 1.45 ns.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

I claim:

1. A memory cell for use in a computer memory array comprising:
    means for electronically storing a binary value;
    means for writing the binary value to said storing means; and
    means for reading the binary value from said storing means, said reading means including means for outputting the binary value to one or more of a plurality of bit lines, wherein said reading means has a first access time if the binary value is output to all of said plurality of bit lines, and said reading means has a second access time if the binary value is output to less than all of said plurality of bit lines, said second access time being faster than said first access time.

2. The memory cell of claim 1 wherein:
    said storing means has a storage node; and
    said reading means further includes a plurality of first switching devices, each said first switching device coupling a respective one of said bitlines to one or more second switching devices which are further coupled to ground, each of said first switching devices being controlled, respectively, by one of a plurality of read wordlines, and said one or more second switching devices being controlled by said storage node.

3. The memory cell of claim 2 wherein there are three bitlines connected respectively to three of said first switching devices, which are further connected to only one second switching device.

4. The memory cell of claim 2 wherein:
    said first switching devices are read port CMOS transistors having approximately the same width; and
    said one or more second switching devices are one or more node CMOS transistors, and having a width which is at least twice as wide as said widths of said read port CMOS transistors.

5. The memory cell of claim 1 wherein said reading means further includes:
    a plurality of read port CMOS transistors respectively connected to said plurality of bit lines, each of said read port CMOS transistors having approximately the same width, and being controlled by respective read wordlines; and
    at least one node CMOS transistor coupling said plurality of read port CMOS transistors to ground, said node CMOS transistor being controlled by said storing means, and having a width which is at least twice as wide as said widths of said plurality of read port CMOS transistors.

6. The memory cell of claim 5 wherein said read port and node CMOS transistors are NMOS transistors.

7. The memory cell of claim 1 wherein said reading means further includes:
    a plurality of read port CMOS transistors respectively connected to said plurality of bit lines, each of said read port CMOS transistors having approximately the same width, and being controlled by respective read wordlines; and
    a node CMOS transistor coupling said plurality of read port CMOS transistors to ground, said node CMOS transistor being controlled by said storing means, and having a width which is approximately equal to the sum of said widths of said plurality of read port CMOS transistors.

8. The memory cell of claim 7, wherein said read port and node CMOS transistors are NMOS transistors.

9. The memory cell of claim 1 wherein said writing means includes a write port CMOS transistor coupling a data input to said storing means, said write port CMOS transistor being controlled by a write wordline.

10. The memory cell of claim 1 further comprising means for clearing said storing means.

11. A memory cell for use in a computer memory array, comprising:
    a flip-flop for electronically storing a binary value, said flip-flop having a storage node;
    a data input;
    a write wordline;
    a write port NMOS transistor coupling said data input to said flip-flop, a gate of said write port NMOS transistor being connected to said write wordline;
    a clear input;
    a clear NMOS transistor coupling said storage node to ground, a gate of said clear NMOS transistor being connected to said clear input;
    one or more first NMOS transistors having a gate connected to said storage node, and an electrode connected to ground;
    a plurality of bit lines;
    a plurality of read wordlines; and a plurality of second NMOS transistors, each said second NMOS transistor coupling a respective one of said bitlines to one of said one or more first NMOS transistors, each said second NMOS transistor having a gate connected to a respective one of said read wordlines, wherein the number of first NMOS transistors is less than the number of bitlines.

12. The memory cell of claim 11 wherein said bitlines have a first access time if all of said bitlines are enabled, and said bitlines have a second access time if less than all of said bitlines are enabled, said second access time being faster than said first access time.

13. The memory cell of claim 11 wherein:

each of said second NMOS transistors has approximately the same width; and at least one of said one or more first NMOS transistors has a width which is at least twice as wide as said widths of said second NMOS transistors.

14. The memory cell of claim 11 wherein:

each of said second NMOS transistors has approximately the same width; and said one or more first NMOS transistors have a combined width which is approximately equal to a sum of said widths of said second NMOS transistors.

15. The memory cell of claim 11 wherein there are three bitlines connected respectively to three of said second NMOS transistors, which are further connected to only one first NMOS transistor.

* * * * *